US010181465B2

(12) United States Patent
Zhang et al.

(10) Patent No.: US 10,181,465 B2
(45) Date of Patent: Jan. 15, 2019

(54) ARRAY SUBSTRATE, DISPLAY DEVICE AND MANUFACTURING METHOD OF ARRAY SUBSTRATE

(71) Applicant: BOE TECHNOLOGY GROUP CO., LTD., Beijing (CN)

(72) Inventors: Chunfang Zhang, Beijing (CN); Yan Wei, Beijing (CN); Chao Xu, Beijing (CN); Heecheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/710,014

(22) Filed: Sep. 20, 2017

(65) Prior Publication Data

US 2018/0012885 A1      Jan. 11, 2018

Related U.S. Application Data

(62) Division of application No. 14/366,657, filed as application No. PCT/CN2013/074374 on Apr. 18, 2013, now Pat. No. 9,799,642.

(30) Foreign Application Priority Data

Feb. 4, 2013    (CN) .......................... 2013 1 0043996

(51) Int. Cl.
*H01L 27/32*      (2006.01)
*H01L 27/02*      (2006.01)
(Continued)

(52) U.S. Cl.
CPC ........ *H01L 27/0266* (2013.01); *H01L 27/124* (2013.01); *H01L 27/1214* (2013.01);
(Continued)

(58) Field of Classification Search
CPC ... H01L 27/32–27/326; H01L 51/50–51/5012; H01L 51/525–51/5287;
(Continued)

(56) References Cited

U.S. PATENT DOCUMENTS

| | | |
|---|---|---|
| 5,351,145 A | 9/1994 | Miyata et al. |
| 5,650,358 A | 7/1997 | Gu et al. |

(Continued)

FOREIGN PATENT DOCUMENTS

| | | |
|---|---|---|
| CN | 1591137 A | 3/2005 |
| CN | 1797159 A | 7/2006 |

(Continued)

OTHER PUBLICATIONS

International Search Report and Written Opinion dated Nov. 7, 2013; PCT/CN2013/074374.

(Continued)

*Primary Examiner* — Cuong B Nguyen
*Assistant Examiner* — Samuel Park
(74) *Attorney, Agent, or Firm* — Ladas & Parry LLP

(57) ABSTRACT

Embodiments of the invention provide an array substrate, a display device and a manufacturing method of the array substrate. The array substrate comprises a substrate (10) and a plurality of electrostatic discharge short-circuit rings (20) provided on the substrate. Each of the electrostatic discharge short-circuit rings (20) comprises a gate electrode (22), a gate insulating layer (26), an active layer (21), a source electrode (23), a drain electrode (24) and a passivation layer (30). Each of the electrostatic discharge short-circuit ring (20) further comprises a transparent conductive layer (25) for connecting the gate electrode (22) and the drain electrode (24), and the transparent conductive layer (25) is provided below the passivation layer (30).

3 Claims, 3 Drawing Sheets

(51) Int. Cl.
*H01L 27/12* (2006.01)
*H01L 29/417* (2006.01)
*H01L 29/786* (2006.01)

(52) U.S. Cl.
CPC .... *H01L 27/1259* (2013.01); *H01L 29/41733* (2013.01); *H01L 29/78633* (2013.01)

(58) Field of Classification Search
CPC ............... H01L 2227/32–2227/326; H01L 2251/5323–2251/5361; H01L 2924/12044; H01L 2021/775; H01L 27/1214; H01L 27/124; H01L 27/3232; H01L 51/0076; H01L 27/14603; H01L 27/14605; H01L 27/14609; H01L 27/14812; H01L 27/3248
See application file for complete search history.

(56) References Cited

U.S. PATENT DOCUMENTS

| | | | |
|---|---|---|---|
| 6,642,086 B2 | 11/2003 | Lim et al. | |
| 2001/0045996 A1 | 11/2001 | Kawai et al. | |
| 2004/0005741 A1* | 1/2004 | Takenaka | H01L 27/14687 438/149 |
| 2007/0176176 A1* | 8/2007 | Yamazaki | G09G 3/3233 257/59 |
| 2007/0273802 A1* | 11/2007 | Nakamura | G02F 1/136204 349/40 |
| 2009/0159978 A1* | 6/2009 | Matsubara | H01L 21/76897 257/368 |
| 2011/0007234 A1 | 1/2011 | Liu et al. | |
| 2011/0169005 A1 | 7/2011 | Saito et al. | |
| 2011/0175080 A1* | 7/2011 | Kim | H01L 29/7869 257/43 |
| 2014/0098320 A1 | 4/2014 | Zhang et al. | |

FOREIGN PATENT DOCUMENTS

| | | |
|---|---|---|
| CN | 102902095 A | 1/2013 |
| CN | 203103303 U | 7/2013 |
| KR | 20060021530 A * | 3/2006 |

OTHER PUBLICATIONS

International Preliminary Report on Patentability dated Aug. 4, 2015; PCT/CN2013/074374.
The First Chinese Office Action dated Dec. 8, 2014; Appln. No. 201310043996.X.
USPTO RR dated Feb. 1, 2016 in connection with U.S. Appl. No. 14/366,657.
USPTO NFOA dated Jun. 17, 2016 in connection with U.S. Appl. No. 14/366,657.
USPTO FOA dated Sep. 30, 2016 in connection with U.S. Appl. No. 14/366,657.
USPTO NFOA dated Jan. 26, 2017 in connection with U.S. Appl. No. 14/366,657.
USPTO NOA dated Jun. 22, 2017 in connection with U.S. Appl. No. 14/366,657.

* cited by examiner

ARRAY SUBSTRATE, DISPLAY DEVICE AND MANUFACTURING METHOD OF ARRAY SUBSTRATE

TECHNICAL FIELD

Embodiments of the invention relate to an array substrate, a display device and a manufacturing method of the array substrate.

BACKGROUND

Among flat-panel display devices, thin film transistor liquid crystal display (TFT-LCD) has the advantages of small size, low power consumption, relatively low manufacturing cost, no radiation and the like and thus dominates the flat-panel display market.

At present, the TFT-LCD mainly operates in a Twisted Nematic (TN) mode, a Vertical Alignment (VA) mode, an In-Plane-Switching (IPS) mode or an Advanced Super Dimension Switch (AD-SDS, ADS for short) mode, etc.

FIG. 1 and FIG. 2 show two examples of a TFT-LCD array substrate according to one technique. As shown in FIG. 1 and FIG. 2, the array substrate comprises a substrate 110, an electrostatic discharge short-circuit ring 120 provided on the substrate, and a passivation layer 130. The electrostatic discharge short-circuit ring 120 comprises a gate electrode 122, an active layer 121, a source electrode 123, a drain electrode 124 and a transparent conductive layer 25 for connecting the gate electrode 22 and the drain electrode 24, and the transparent conductive layer 25 is provided above the passivation layer 30.

As a frame of the display device becomes narrower, a wiring region at edges of the array substrate becomes smaller and a distance between components becomes smaller. In addition, the transparent conductive layer 25 is exposed on the outermost layer of the array substrate, and thus it is quite easy to be scratched by other components when the display device is assembled, which renders the electrostatic discharge component of the array substrate unable to work normally, thus affecting the quality of the display device.

SUMMARY OF THE INVENTION

According to the embodiments of the invention, an array substrate is provided. The array substrate comprises a substrate and a plurality of electrostatic discharge short-circuit rings provided on the substrate. Each of the electrostatic discharge short-circuit rings comprises a gate electrode, a gate insulating layer, an active layer, a source electrode, a drain electrode and a passivation layer. Each of the electrostatic discharge short-circuit ring further comprises a transparent conductive layer for connecting the gate electrode and the drain electrode, and the transparent conductive layer is provided below the passivation layer.

For example, the transparent conductive layer is formed between the substrate and the gate insulating layer and partially overlaps the gate electrode; and the gate insulating layer is provided with a via hole, and the drain electrode is connected to the transparent conductive layer through the via hole.

For example, the transparent conductive layer is formed between the substrate and the gate insulating layer and partially overlaps the drain electrode; and the gate insulating layer is provided with a via hole, and the gate electrode is connected to the transparent conductive layer through the via hole.

For example, the gate electrode, the gate insulating layer, the active layer, the source electrode and the drain electrode and the passivation layer are sequentially formed on the substrate; the electrostatic discharge short-circuit ring further comprises a second passivation layer and a planarization layer, the second passivation layer is provided between the source and drain electrodes and the passivation layer, and the planarization layer is provided between the passivation layer and the second passivation layer; the planarization layer and the second passivation layer are provided with a first via hole and a second via hole; and the transparent conductive layer is provided between the planarization layer and the passivation layer, and the transparent conductive layer is connected to the gate electrode through the first via hole and is connected to the drain electrode through the second via hole.

For example, the active layer, the source electrode and the drain electrode, the gate insulating layer, the gate electrode and the passivation layer are sequentially formed on the substrate; the electrostatic discharge short-circuit ring further comprises a second passivation layer and a planarization layer, the second passivation layer is provided between the gate electrode and the passivation layer, and the planarization layer is provided between the passivation layer and the second passivation layer; the planarization layer and the second passivation layer are provided with a first via hole and a second via hole; and the transparent conductive layer is provided between the planarization layer and the passivation layer; and the transparent conductive layer is connected to the gate electrode through the first via hole and is connected to the drain electrode through the second via hole.

For example, the planarization layer is a resin layer.

According to the embodiments of the invention, a display device is provided. The display device comprises the above-described array substrate.

According to the embodiments of the invention, a manufacturing method of an array substrate is provided. The array substrate comprises a substrate and a plurality of electrostatic discharge short-circuit rings provided on the substrate. The method comprises a step of forming the electrostatic discharge short-circuit rings. The step of forming the electrostatic discharge short-circuit rings comprises: forming a gate electrode; forming a gate insulating layer; forming an active layer, a source electrode and a drain electrode; forming a transparent conductive layer for connecting the gate electrode and the drain electrode; and forming a passivation layer. The transparent conductive layer is provided below the passivation layer.

For example, the gate electrode, the gate insulating layer, the active layer, the source electrode and the drain electrode and the passivation layer are sequentially formed on the substrate. Before the step of forming the passivation layer, the method comprises: forming the transparent conductive layer which is provided between the substrate and the gate insulating layer and partially overlaps the gate electrode; forming a via hole in a portion of the gate insulating layer above the transparent conductive layer; and forming the drain electrode on the gate insulating layer, wherein the drain electrode is connected to the transparent conductive layer through the via hole.

For example, the active layer, the source electrode and the drain electrode, the gate electrode and the passivation layer are sequentially formed on the substrate. Before the step of forming the passivation layer, the method comprises: forming the transparent conductive layer which is provided between the substrate and the gate insulating layer and partially overlaps the drain electrode; forming a via hole in a portion of the gate insulating layer above the transparent conducing layer; and forming the gate electrode on the gate insulating layer, wherein the gate electrode is connected to the transparent conductive layer through the via hole.

For example, the gate electrode, the gate insulating layer, the active layer, the source electrode and the drain electrode and the passivation layer are sequentially formed on the substrate. Before the step of forming the passivation layer, the method comprises: forming a second passivation layer on the source electrode and the drain electrode to cover the substrate; forming a planarization layer on the second passivation layer to cover the second passivation layer; forming a first via hole in a portion of the planarization layer and the second passivation layer above the gate electrode, and forming a second via hole in a portion of the planarization layer and the second passivation layer above the drain electrode; and forming the transparent conductive layer on the planarization layer, wherein the transparent conductive layer is connected to the gate electrode through the first via hole and is connected to the drain electrode through the second via hole.

For example, the active layer, the source electrode and the drain electrode, the gate insulating layer, the gate electrode and the passivation layer are sequentially formed on the substrate. Before the step of forming the passivation layer, the method comprises: forming a second passivation layer on the gate electrode; forming a planarization layer on the second passivation layer to cover the second passivation layer; forming a first via hole in a portion of the planarization layer and the second passivation layer above the gate electrode, and forming a second via hole in a portion of the planarization layer and the second passivation layer above the drain electrode; and forming the transparent conductive layer on the planarization layer, wherein the transparent conductive layer is connected to the gate electrode through the first via hole and is connected to the drain electrode through the second via hole.

According to the embodiments of the invention, the transparent conductive layer is provided below the passivation layer so as to prevent the transparent conductive layer from being scratched by other components of the display device, thus the security of the array substrate is enhanced and the quality of the display device is guaranteed.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiments of the invention provide an array substrate. A transparent conductive layer is provided below a passivation layer, to prevent the transparent conductive layer from being scratched by other components of the display device. In this way, the array substrate is prevented from being damaged, and thus the quality of the display device is guaranteed.

Figure 1:
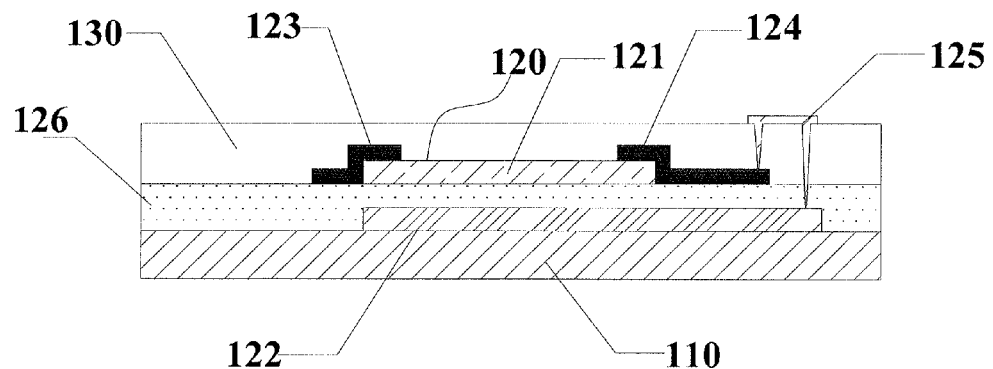
FIG. 1 is a structural schematic diagram illustrating an array substrate according to one technology.
Figure 2:
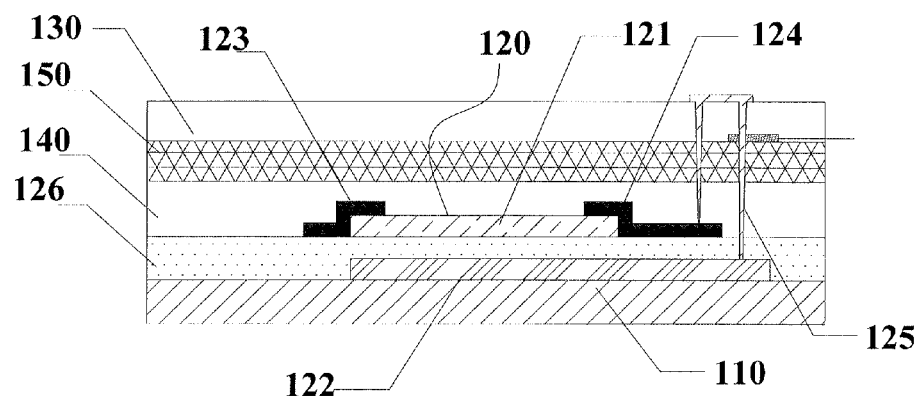
FIG. 2 is another structural schematic diagram illustrating the array substrate according to one technology.
Figure 3:
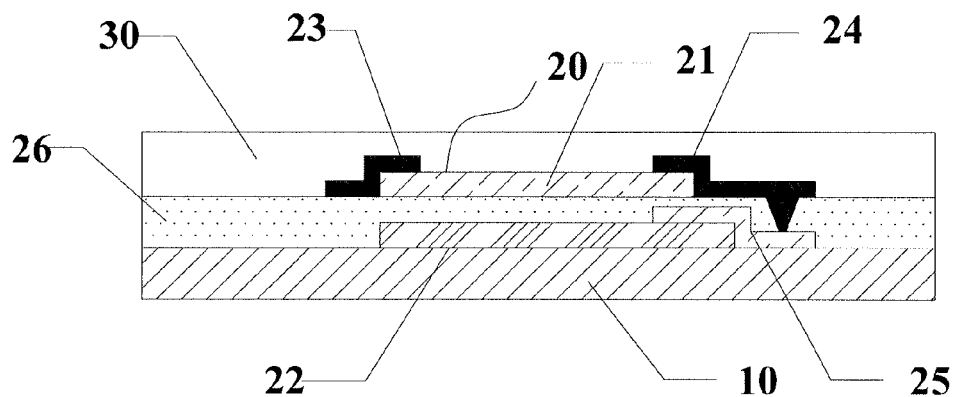
FIG. 3 is a structural schematic diagram illustrating an array substrate according to a first embodiment of the invention.

FIG. 3 is a structural schematic diagram illustrating the array substrate according to a first embodiment of the invention.

As shown in FIG. 3, the array substrate according to the embodiment comprises a substrate 10 and a plurality of electrostatic discharge short-circuit rings 20 provided on the substrate 10.

Each of the electrostatic discharge short-circuit rings 20 comprises a gate electrode 22, a gate insulating layer 26, an active layer 21, a source electrode 23, a drain electrode 24 and a passivation layer 30. In addition, each electrostatic discharge short-circuit ring 20 further comprises a transparent conductive layer 25 for connecting the gate electrode 22 and the drain electrode 24, and the transparent conductive layer 25 is provided below the passivation layer 30.

In the embodiment, the transparent conductive layer 25 is provided below the passivation layer 30, so as to protect the transparent conductive layer 25 by the passivation layer 30 and prevent the transparent conductive layer 25 from being scratched by other components of the display device, thus the security of the array substrate is enhanced and the quality of the display device is guaranteed.

As shown in FIG. 3, the array substrate is a bottom-gate substrate. The electrostatic discharge short-circuit ring 20 comprises the gate electrode 22 provided on a substrate 10, the gate insulating layer 26 provided on the gate electrode 22 and the substrate 10, the active layer 21 provided on the gate insulating layer 26 and above the gate electrode 22, the source electrode 23 and the drain electrode 24 provided on both sides of the active layer 21, the transparent conductive layer 25 for connecting the drain electrode 24 and the gate electrode 22, and the passivation layer 30 covering the active layer 21 as well as the source electrode 23 and the drain electrode 24.

For example, the transparent conductive layer 25 is provided between the substrate 10 and the gate insulating layer 26 and partially overlaps the gate electrode 22. The gate insulating layer 26 is provided with a via hole, and the drain electrode 24 is connected to the transparent conductive layer 25 through the via hole. For example, a deposition layer is formed on the substrate 10 through a sputtering process, and then the deposition layer is patterned through exposure, developing and etching processes so as to form the transparent conductive layer 25.

Figure 4:
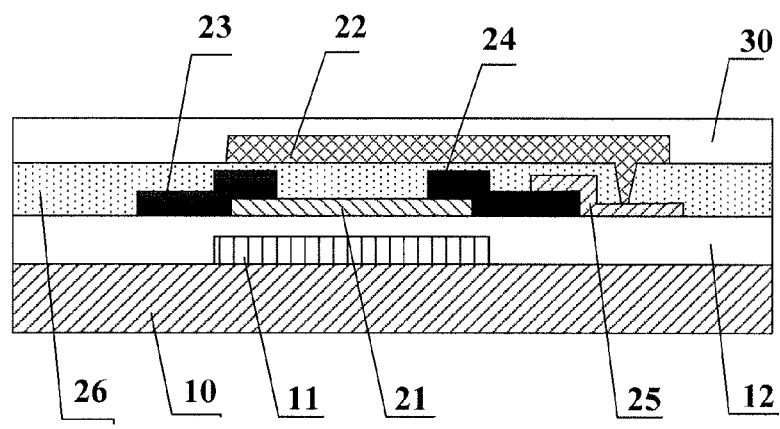
FIG. 4 is a structural schematic diagram illustrating a modification of the array substrate according to the first embodiment of the invention.

FIG. 4 is a structural schematic diagram illustrating a modification of the array substrate according to the first embodiment of the invention. As shown in FIG. 4, the array substrate is a top-gate substrate. In such case, the active layer 21, the source electrode 23 and the drain electrode 24, the gate insulating layer 26, the gate electrode 22 and the passivation layer 30 are sequentially formed on the substrate 10. The transparent conductive layer 25 is provided between the substrate 10 and the gate insulating layer 26 and partially overlaps the drain electrode 24. The gate insulating layer 26 is provided with the via hole, and the gate electrode 22 is connected to the transparent conductive layer 25 through the via hole.

In addition, as shown in FIG. 4, the array substrate further comprises a light shielding layer 11 provided on the substrate 10 and an insulating layer 12 formed on the light shielding layer 11 and the substrate 10. In such case, the active layer 21 is formed on the insulating layer 12, and the transparent conductive layer 25 is provided between the insulating layer 12 and the gate insulating layer 26.

Figure 5:
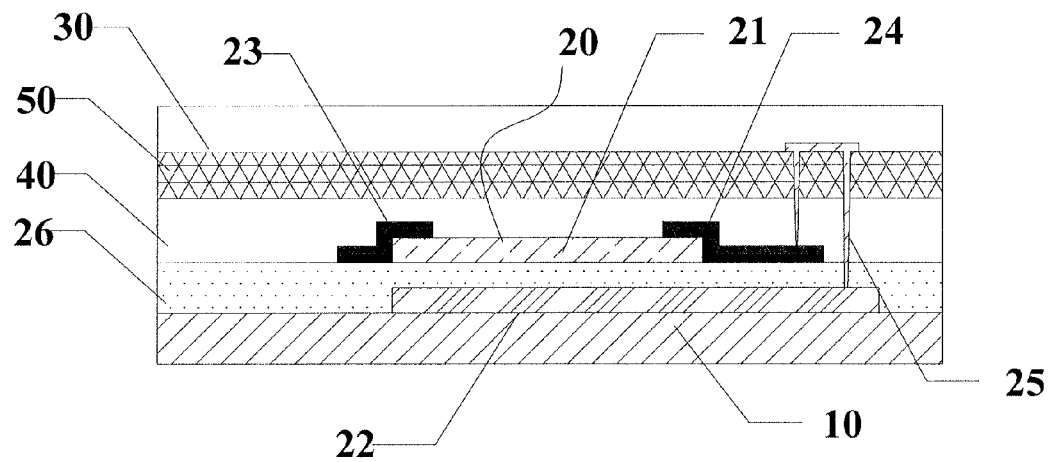
FIG. 5 is a structural schematic diagram illustrating an array substrate according to a second embodiment of the invention.

FIG. 5 is a structural schematic diagram illustrating the array substrate according to a second embodiment of the invention. As shown in FIG. 5, the array substrate according to the embodiment comprises a substrate 10 and a plurality of electrostatic discharge short-circuit rings 20 provided on the substrate 10.

Each of the electrostatic discharge short-circuit rings 20 comprises a gate electrode 22, a gate insulating layer 26, an active layer 21, a source electrode 23, a drain electrode 24, a passivation layer 30, a second passivation layer 40 and a planarization layer 50 provided between the passivation layer 30 and the second passivation layer 40. In addition, each of the electrostatic discharge short-circuit rings 20 further comprises a transparent conductive layer 25 for connecting the gate electrode 22 and the drain electrode 24, and the transparent conductive layer 25 is provided below the passivation layer 30.

As shown in FIG. 5, the second passivation layer 40 is provided on the source electrode 23 and the drain electrode 24, the planarization layer 50 is provided on the second passivation layer 40, and the passivation layer 30 is provided on the planarization layer 50. For example, the planarization layer 50 is a resin layer. The planarization layer 50 and the second passivation layer 40 are provided with a first via hole and a second via hole, and the first via hole and the second via hole respectively reach the gate electrode 22 and the drain electrode 24. The transparent conductive layer 25 is provided between the planarization layer 50 and the passivation layer 30, and the transparent conductive layer 25 is connected to the gate electrode 22 through the first via hole and is connected to the drain electrode 24 through the second via hole.

Figure 6:
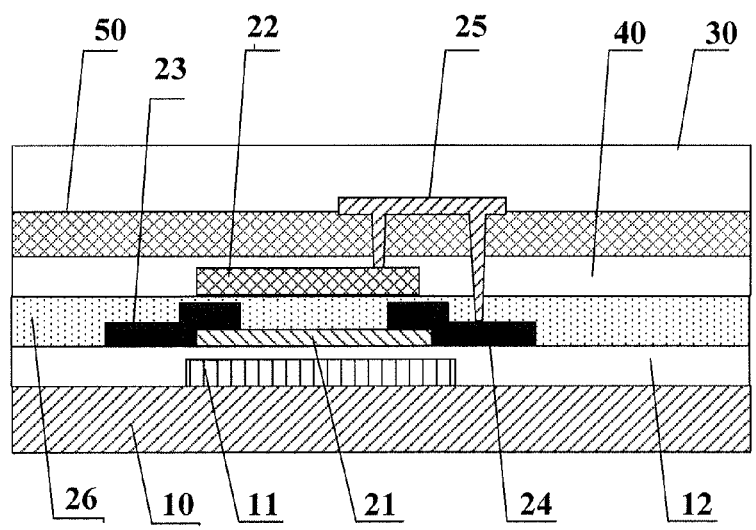
FIG. 6 is a structural schematic diagram illustrating a modification of the array substrate according to the second embodiment of the invention.

FIG. 6 is a structural schematic diagram illustrating a modification of the array substrate according to the second embodiment of the invention. As shown in FIG. 6, the array substrate is a top-gate substrate. In such case, the active layer 21, the source electrode 23 and the drain electrode 24, the gate insulating layer 26, the gate electrode 22 and the passivation layer 30 are sequentially formed on the substrate. The electrostatic discharge short-circuit ring further comprises the second passivation layer 40 provided between the gate electrode 22 and the passivation layer 30, and the planarization layer 50 provided between the passivation layer 30 and the second passivation layer 40. The planarization layer 50 and the second passivation layer 40 are provided with the first via hole and the second via hole. The transparent conductive layer 25 is provided between the planarization layer 50 and the passivation layer 30, and the transparent conductive layer 25 is connected to the gate electrode 22 through the first via hole and is connected to the drain electrode 24 via the second via hole.

In addition, as shown in FIG. 6, the array substrate further comprises a light shielding layer 11 provided on the substrate 10 and an insulating layer 12 formed on the light shielding layer 11 and the substrate 10. In such case, the active layer 21 is formed on the insulating layer 12.

For example, the substrate 10 is a glass substrate, a resin substrate or a plastic substrate.

For example, the gate insulating layer 26 is a silicon oxide layer or a silicon nitride layer.

For example, the transparent conductive layer 25 is made from a material with good transmittance and conductivity, such as tin indium oxide (ITO).

Embodiments of the invention further provide a display device. The display device comprises any one of the array substrates mentioned above. The display device may be any product or component having a display function, such as a liquid crystal panel, an electronic paper, a mobile phone, a tablet PC, a TV, a display, a notebook computer, a digital photo frame, a navigator, etc.

Embodiments of the invention further provide a manufacturing method of an array substrate. The method comprises: forming a gate electrode; forming a gate insulating layer; forming an active layer, a source electrode and a drain electrode; forming a transparent conductive layer for connecting the gate electrode and the drain electrode; and forming a passivation layer. The transparent conductive layer is provided below the passivation layer.

For example, the array substrate shown in FIG. 3 is manufactured by the following steps.

Step 201: depositing a gate metal layer on the substrate through a sputtering process, and forming the gate electrode 22 through exposure, developing and etching processes;

Step 202: depositing a tin indium oxide film on the substrate through the sputtering process, and forming the transparent conductive layer 25 through exposure, developing and etching processes, wherein the transparent conductive layer 25 partially overlaps the gate electrode 22;

Step 203: depositing a silicon nitride layer or a silicon dioxide layer on the substrate through a plasma enhanced chemical vapor deposition process to form the gate insulating layer 26;

Step 204: depositing a semiconductor layer on the gate insulating layer 26 through the plasma enhanced chemical vapor deposition process, and forming the active layer 21 through exposure, developing and etching processes;

Step 205: forming the via hole in a portion of the gate insulating layer 26 above the transparent conductive layer 25 through a dry etching process;

Step 206: depositing a metal layer on the gate insulating layer 26 through the sputtering process, and forming the source electrode 23 and the drain electrode 24 through exposure, developing and etching processes, wherein the drain electrode 24 is connected with the transparent conductive layer 25 through the via hole; and Step 207: forming the passivation layer 30 through the plasma enhanced chemical vapor deposition process.

For example, the array substrate shown in FIG. 4 is manufactured by the following steps.

Step 201: depositing the semiconductor layer on the substrate 10 through the plasma enhanced chemical vapor deposition, and forming the active layer 21 through exposure, developing and etching processes;

Step 202: depositing the metal layer on the substrate 10 through the sputtering process, and forming the source electrode 23 and the drain electrode 24 through exposure, developing and etching processes;

Step 203: depositing the tin indium oxide film on the substrate through the sputtering process, and forming the transparent conductive layer 25 through exposure, developing and etching processes, wherein the transparent conductive layer 25 partially overlaps the drain electrode 24;

Step 204: depositing the silicon nitride layer or the silicon dioxide layer on the substrate through the plasma enhanced chemical vapor deposition process to form the gate insulating layer 26;

Step 205: forming the via hole in a portion of the gate insulating layer 26 above the transparent conductive layer 25 through the dry etching process;

Step 206: depositing the gate metal layer on the substrate through the sputtering process, and forming the gate electrode 22 through exposure, developing and etching processes, wherein the gate electrode 22 is connected with the transparent conductive layer 25 through the via hole;

Step 207: forming the passivation layer 30 through the plasma enhanced chemical vapor deposition.

In addition, as shown in FIG. 4, the light shielding layer 11 is further formed on the substrate 10 before the active layer 21 is formed, and the insulating layer 12 is formed on the light shielding layer 11 and the substrate 10. In such case, the active layer 21 is formed on the insulating layer 12, and the transparent conductive layer 25 is provided between the insulating layer 12 and the gate insulating layer 26.

For example, the array substrate shown in FIG. 5 is manufactured by the following steps.

Step 301: depositing the gate metal layer on the substrate through the sputtering process, and forming the gate electrode 22 through exposure, developing and etching processes;

Step 302: depositing the silicon nitride layer or the silicon dioxide layer on the substrate through the plasma enhanced chemical vapor deposition process to form the gate insulating layer 26;

Step 303: depositing the semiconductor layer on the gate insulating layer 26 through the plasma enhanced chemical vapor deposition process, and forming the active layer 21 through exposure, developing and etching processes;

Step 304: forming the metal layer on the gate insulating layer 26 through the sputtering process, and forming the source electrode 23 and the drain electrode 24 through exposure, developing and etching processes;

Step 305: forming the second passivation layer 40 on the gate insulating layer and the active layer through the plasma enhanced chemical vapor deposition process;

Step 306: forming the planarization layer 50 on the second passivation layer 40 by a coating process;

Step 307: forming the first via hole in a portion of the planarization layer 50 and the second passivation layer 40 above the gate electrode and forming the second via hole in a portion of the planarization layer 50 and the second passivation layer 40 above the drain electrode through the dry etching process;

Step 308: depositing the tin indium oxide film on the planarization layer 50 through the sputtering process, and forming the transparent conductive layer 25 through exposure, developing and etching processes, wherein the transparent conductive layer 25 is connected to the gate electrode 22 through the first via hole and is connected to the drain electrode 24 through the second via hole;

Step 309: forming the passivation layer 30 on the planarization layer 50 through the plasma enhanced chemical vapor deposition process.

For example, the array substrate shown in FIG. 6 is manufactured by the following steps.

Step 301: depositing the semiconductor layer on the substrate 10 through the plasma enhanced chemical vapor deposition process, and forming the active layer 21 through exposure, developing and etching processes;

Step 302: depositing the metal layer on the substrate 10 through the sputtering process, and forming the source electrode 23 and the drain electrode 24 through exposure, developing and etching processes;

Step 303: depositing the silicon nitride layer or the silicon dioxide layer on the substrate through the plasma enhanced chemical vapor deposition process to form the gate insulating layer 26;

Step 304: depositing the gate metal layer on the gate insulating layer 26 through the sputtering process, and forming the gate electrode 22 through exposure, developing and etching processes;

Step 305: forming the second passivation layer 40 on the gate insulating layer 26 and the gate electrode 22 through the plasma enhanced chemical vapor deposition process;

Step 306: forming the planarization layer 50 on the second passivation layer 40 by the coating process;

Step 307: forming the first via hole in a portion of the planarization layer 50 and the second passivation layer 40 above the gate electrode and forming the second via hole in a portion of the planarization layer 50 and the second passivation layer 40 above the drain electrode through the dry etching process;

Step 308: depositing the tin indium oxide film on the planarization layer 50 through the sputtering process, and forming the transparent conductive layer 25 through exposure, developing and etching processes, wherein the transparent conductive layer 25 is connected to the gate electrode 22 through the first via hole and is connected to the drain electrode 24 through the second via hole;

Step 309: forming the passivation layer 30 on the planarization layer 50 through the plasma enhanced chemical vapor deposition process.

In addition, as shown in FIG. 6, the light shielding layer 11 is further formed on the substrate 10 before the active layer 21 is formed, and the insulating layer 12 is formed on the light shielding layer 11 and the substrate 10. In such case, the active layer 21 is formed on the insulating layer 12.

By the methods mentioned above, the transparent conductive layer is formed so that the transparent conductive layer is protected by the passivation layer provided above the transparent conductive layer. Accordingly, the transparent conductive layer is prevented from being scratched by other components of the display device.

The foregoing embodiments merely are exemplary embodiments of the invention, and not intended to define the scope of the invention, and the scope of the invention is determined by the appended claims.

What is claimed is:

1. An array substrate, comprising a substrate and a plurality of electrostatic discharge short-circuit rings provided on the substrate, each of the electrostatic discharge short-circuit rings comprising a gate electrode, a gate insulating layer, an active layer, a source electrode, a drain electrode and a passivation layer, wherein each of the electrostatic discharge short-circuit ring further comprises a transparent conductive layer for connecting the gate electrode and the drain electrode, the transparent conductive layer is provided below the passivation layer, the transparent conductive layer only overlaps and directly contacts a portion of an upper surface, facing away from the substrate, of the drain electrode, and a material for forming the transparent conductive layer is different from a material for forming the drain electrode;

the array substrate further comprises an insulating layer provided on the substrate, the gate insulating layer is provided on the insulating layer, and all of the active layer, the source electrode, the drain electrode, and the transparent conductive layer are provided between the insulating layer and the gate insulating layer and directly contact both of the insulating layer and the gate insulating layer; and the gate insulating layer is provided between the gate electrode and the active layer, the gate insulating layer is provided with a via hole exposing the transparent conductive layer, and the gate electrode extends into the via hole to directly contact the transparent conductive layer.

2. A display device, comprising an array substrate, wherein the array substrate comprises a substrate and a plurality of electrostatic discharge short-circuit rings provided on the substrate, each of the electrostatic discharge short-circuit rings comprises a gate electrode, a gate insulating layer, an active layer, a source electrode, a drain electrode and a passivation layer, and each of the electrostatic discharge short-circuit ring further comprises a transparent conductive layer for connecting the gate electrode and the drain electrode, the transparent conductive layer is provided below the passivation layer, the transparent conductive layer only overlaps and directly contacts a portion of an upper surface, facing away from the substrate, of the drain electrode, and a material for forming the transparent conductive layer is different from a material for forming the drain electrode;

the array substrate further comprises an insulating layer provided on the substrate, the gate insulating layer is provided on the insulating layer, and all of the active layer, the source electrode, the drain electrode, and the transparent conductive layer are provided between the insulating layer and the gate insulating layer and directly contact both of the insulating layer and the gate insulating layer; and the gate insulating layer is provided between the gate electrode and the active layer, the gate insulating layer is provided with a via hole exposing the transparent conductive layer, and the gate electrode extends into the via hole to directly contact the transparent conductive layer.

3. A manufacturing method of an array substrate, the array substrate comprising a substrate and a plurality of electrostatic discharge short-circuit rings provided on the substrate, wherein the method comprises a step of forming the electrostatic discharge short-circuit rings;

the step of forming the electrostatic discharge short-circuit rings comprises: forming a gate electrode; forming a gate insulating layer; forming an active layer, a source electrode and a drain electrode; forming a transparent conductive layer for connecting the gate electrode and the drain electrode; and forming a passivation layer; and the transparent conductive layer is provided below the passivation layer, the transparent conductive layer only overlaps and directly contacts a portion of an upper surface, facing away from the substrate, of the drain electrode, and a material for forming the transparent conductive layer is different from a material for forming the drain electrode;

the array substrate further comprises an insulating layer provided on the substrate, the gate insulating layer is provided on the insulating layer, and all of the active layer, the source electrode, the drain electrode, and the transparent conductive layer are provided between the insulating layer and the gate insulating layer and directly contact both of the insulating layer and the gate insulating layer; and the gate insulating layer is provided between the gate electrode and the active layer, the gate insulating layer is provided with a via hole exposing the transparent conductive layer, and the gate electrode extends into the via hole to directly contact the transparent conductive layer.

* * * * *